US005608260A

United States Patent [19]
Carper et al.

[11] Patent Number: 5,608,260
[45] Date of Patent: Mar. 4, 1997

[54] LEADFRAME HAVING CONTACT PADS DEFINED BY A POLYMER INSULATING FILM

[75] Inventors: James L. Carper, Colchester; Gary H. Irish, Jericho, both of Vt.; Sheldon C. Rieley, St. Thomas, Virgin Islands (U.S.); Robert M. Smith, Jericho, Vt.; Robert L. Jackson, San Jose, Calif.

[73] Assignee: International Business Machines Corporation, Armonk, N.Y.

[21] Appl. No.: 366,633

[22] Filed: Dec. 30, 1994

[51] Int. Cl.$^6$ ............................................... H01L 23/495
[52] U.S. Cl. ........................... 257/666; 257/669; 257/677
[58] Field of Search ........................... 257/666, 676, 257/677, 669

[56] References Cited

U.S. PATENT DOCUMENTS

| | | | |
|---|---|---|---|
| 4,883,774 | 11/1989 | Djennas et al. | 257/677 |
| 5,072,280 | 12/1991 | Matsukura | 257/666 |
| 5,086,018 | 2/1992 | Conru et al. | 437/207 |
| 5,424,578 | 6/1995 | Fujita et al. | 257/666 |

FOREIGN PATENT DOCUMENTS 6-29438   2/1994   Japan ...................................... 257/677

OTHER PUBLICATIONS

S. J. Krumbein, "Metallic Electromigration Phenomena" IEEE Transactions on Components, Hybrids, and Manufacturing Technology, vol. 11, No. 1, Mar. 1988, pp. 5–15.

E. J. Dombroski et al., "Thin Small Outline Packages", IBM Technical Disclosure Bulletin, vol. 34, No. 1, Jun. 1991, pp. 358–359.

*Primary Examiner*—Sara W. Crane
*Assistant Examiner*—Roy Potter
*Attorney, Agent, or Firm*—James M. Leas

[57] ABSTRACT

A leadframe has conductive fingers with an insulating film located on a first portion of the fingers. The insulating film has openings into which contact pads formed of a noble metal are provided. Pads on a chip are wire bonded to these contact pads on the leadframe. The first portion is encapsulated in a molded package. The structure inhibits silver migration, provides insulation between wires and leadframe, and provides improved adhesion between plastic package and leadframe. A single insulating film with openings for providing the contact pads provides all these features.

14 Claims, 4 Drawing Sheets

LEADFRAME HAVING CONTACT PADS DEFINED BY A POLYMER INSULATING FILM

FIELD OF THE INVENTION

This invention relates generally to semiconductor packaging. More particularly, it relates to leadframes having a silver coating for wire bonding and to a process for making such leadframes.

BACKGROUND OF THE INVENTION

Wire bonding chips to metal leadframes coated with silver is widely practiced in the semiconductor industry. The silver offers a surface capable of forming a reliable bond. Applicants have identified three problems in prior art approaches that cause fails either on the production line or out in the field: (1) in the presence of moisture, silver tends to migrate across an insulator separating conductors held at different potentials, shorting the conductors; (2) wire bond wires crossing over exposed conductors of the leadframe may short to those conductors; and (3) plastic compounds used to seal the package often do not adhere well to silver.

Various methods have been disclosed in the prior art that address these problems individually. U.S. Pat. No. 4,883,774 to Djennas et al. (the '774 patent) teaches the use of electroless plating to produce a very thin and uniform silver layer across the entire surface of the leadframe. The '774 patent teaches that uniformly deposited silver enhances adhesion between leadframe and plastic encapsulant. The '774 patent also teaches that uniformly deposited silver avoids material gradients that cause silver diffusion. However, it is well known that uniform deposition does not prevent the above-mentioned form of silver migration across an insulator (that is, migration caused by an applied voltage between conductors in the presence of moisture). This migration is not driven by material gradients; it is caused by drift of ions in an electric field, as described in a paper "Metallic Electromigration Phenomena," by S. J. Krumbein, *IEEE Transactions on Components, Hybrids, and Manufacturing Technology*, Vol. 11, No. 1, March, 1988, pp. 5–15.

Shorting between wire and leadframe fingers has been addressed in a technical disclosure "Thin Small Outline Packages," by E. J. Dombroski et al., *IBM Technical Disclosure Bulletin*, Vol. 34, No. 1, June 1991, pp. 358–359. Here screened and punched tape coatings at wire crossing locations have been used for improved isolation of wire and lead. However, this requires additional processing and cost specifically to achieve improved isolation, without addressing the two other above-mentioned concerns.

The present invention efficiently solves all three problems, providing reduced silver migration between leadframe fingers held at different potentials, improved isolation between leadframe and wire-bond wires, and improved adhesion between plastic encapsulant and leadframe.

SUMMARY OF THE INVENTION

It is therefore an object of the present invention to provide a leadframe structure designed to reduce the migration of silver across insulator separating conductors held at different potentials in the presence of moisture;

It is another object of this invention to prevent shorts between wire bond wires and conductive portions of the leadframe;

It is another object of this invention to improve adhesion between plastic compounds used to seal a semiconductor package and the leadframe;

It is another object of this invention to provide a simple method, involving the patterning of a single layer of material, to accomplish all of the above objects.

These and other objects of the invention are accomplished by a semiconductor package comprising a leadframe having a contact finger with a portion for encapsulation within the package. This portion has a first and a second region, the first region being covered by an insulating film, the second region being uncovered by the insulating film. The second region has a contact metal thereon, wherein the contact metal provides a pad for contacting the leadframe. The first region is substantially free of the contact metal.

Preferably, the noble metal is silver, the insulating film is photo-imagable, and the second region is a photolithographically formed opening in the insulating film that is recessed from an edge of the finger that is adjacent a second finger. Spacing the silver away from this edge increases the distance between the silver pad and a finger that may be held at a different electrical potential. The electric field providing the drive for silver migration is thereby reduced. Photolithography permits the opening to be small in size, no larger than required for forming a reliable wire bond in a later step. The photolithographic process also readily permits the opening to be recessed from the edge.

Preferably, a thin film of silver is plated after the small opening is formed. The thin film and the small size of the opening both limit the quantity of silver available for migration, further reducing the possibility of silver migration-shorting.

The photolithographically patterned insulating film can serve six functions in the finished device according to preferred embodiments of the present invention: (1) to limit the area of silver plating to those regions where it is needed for wire bonding, thereby decreasing the cost of silver; (2) to insulate between wires and leadframe, eliminating the potential for shorting; (3) to provide a surface leadframe material to which plastic encapsulant readily adheres; (4) to limit the quantity of silver available for migration; (5) to increase the distance between the silver coated portion of a leadframe finger and adjacent fingers to reduce the electric field driving silver migration and increase the distance over which silver must migrate to cause a short; and (6) to serve as a photo-imagable material.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

Semiconductor packages are frequently formed by bonding a semiconductor chip to a metallic leadframe and encapsulating in plastic. Leadframes are typically formed from highly conductive materials such as copper or alloys.

Leadframes and processes for forming leadframes are described in commonly assigned U.S. Pat. No. 5,086,018 to Conru et al. incorporated herein by reference.

The leadframe of the present invention has an insulating film designed to reduce silver migration, avoid shorts between wires and leadframe, and improve adhesion between plastic encapsulant and leadframe. Photolithographic and plating processes are used to contact pads through the insulating film at appropriate positions along fingers of the leadframe adjacent the region in which the chip is attached. Contact pads on fingers held at an elevated potential relative to an adjacent finger are preferably separated from edges of the fingers by portions of the insulating film to increase the distance and thereby reduce the electric field driving silver migration, provide a barrier to the migration, and increase the distance over which silver must migrate to cause a short.

The process sequence for forming the improved leadframe and semiconductor package of the present invention consists of two primary components: (1) deposition of an insulator and patterning of the insulator to provide openings to the conductive surface of the leadframe at wire bond locations, and (2) deposition of silver within the openings. As described hereinafter, several different methods may be used to form the insulator pattern and to deposit the silver.

Figure 1:
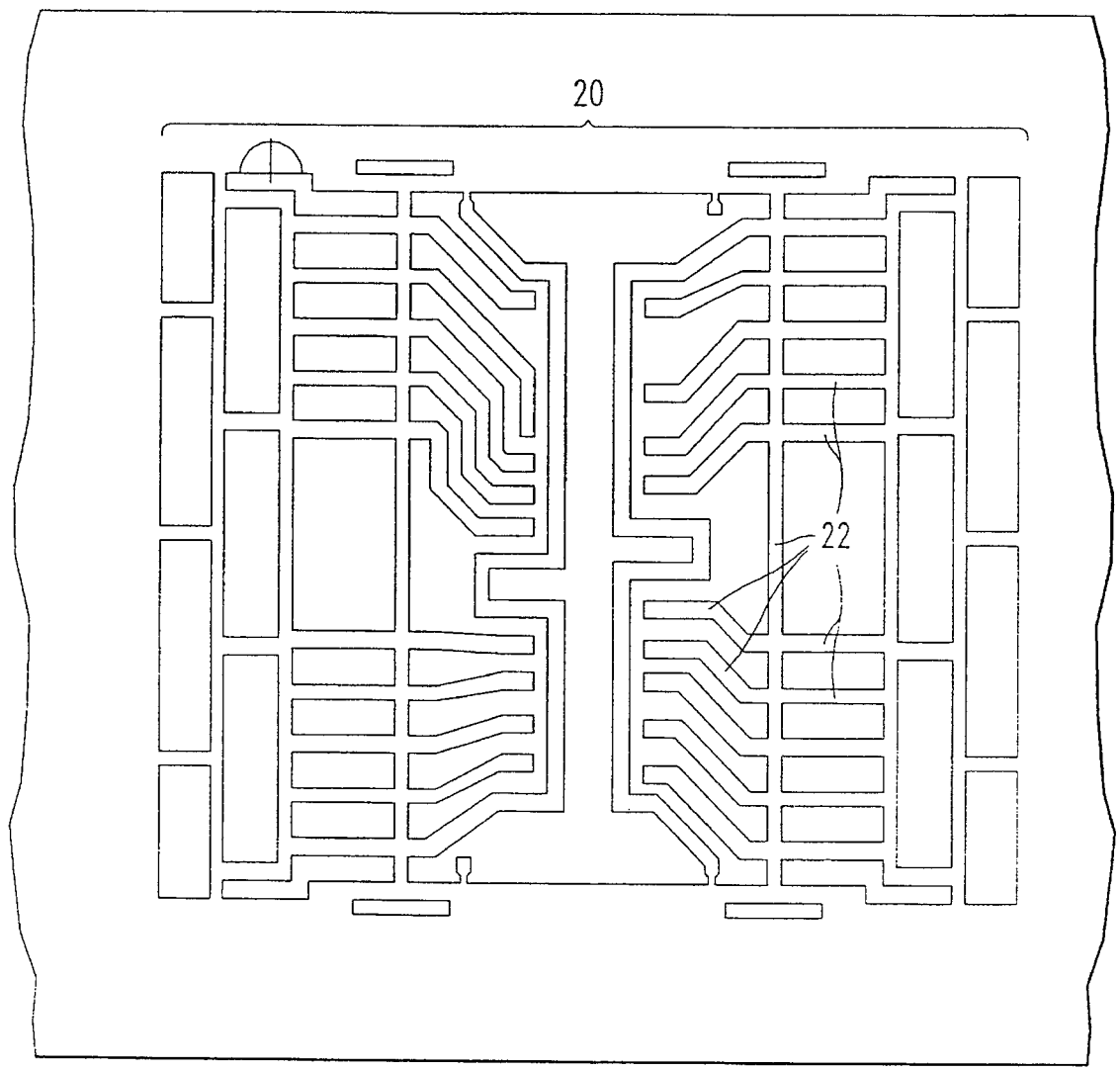
FIGS. 1–3 are top views showing the structure at several steps in the process for making a coated leadframe of the present invention.

Preferred process steps for forming the improved leadframe and semiconductor device are illustrated in FIGS. 1–4. Metallic leadframe 20, illustrated in FIG. 1 is typically patterned by standard methods known in the art so as to form fingers 22.

Figure 2:
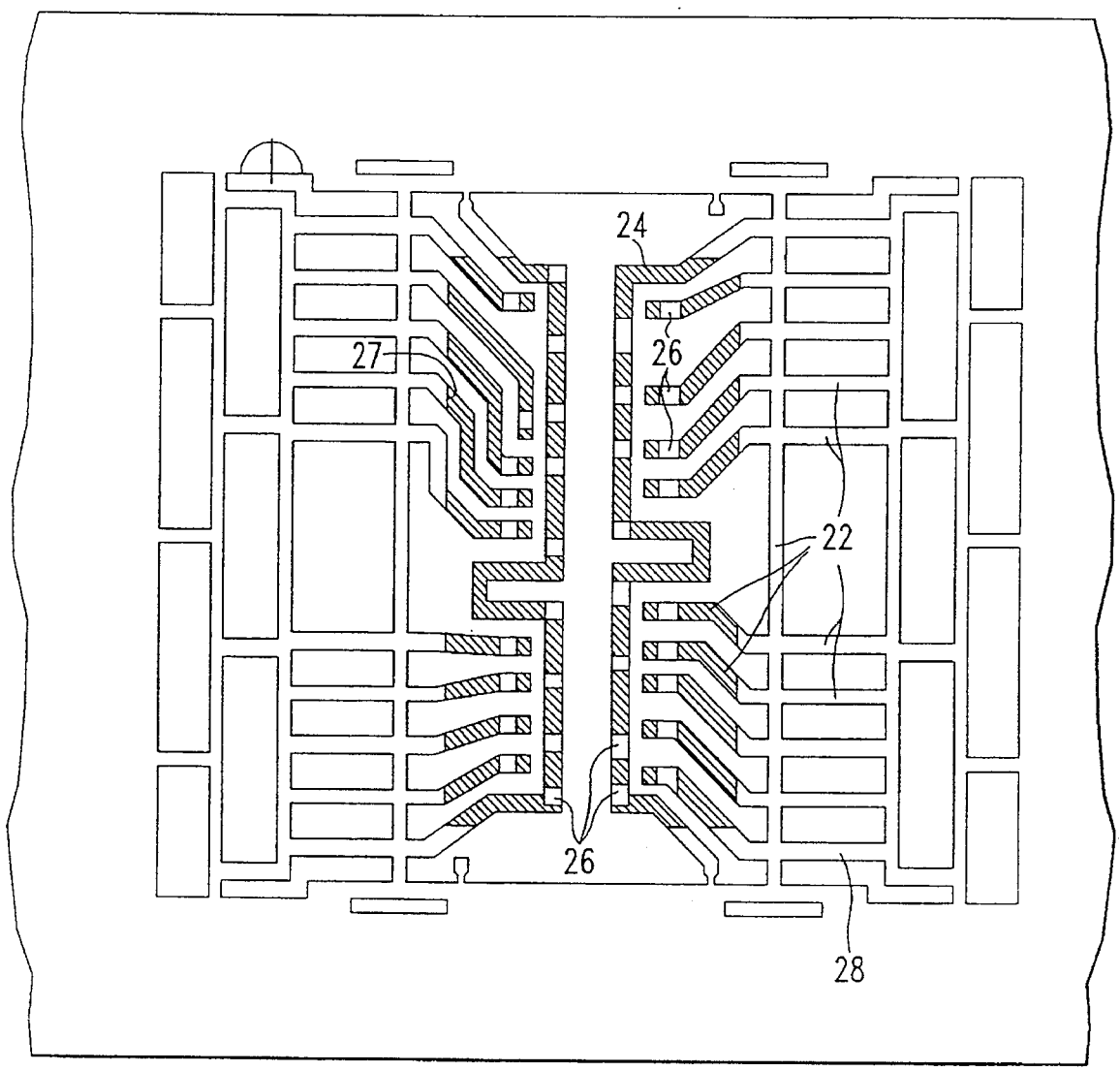

With reference to FIG. 2, insulating film 24 is applied or deposited on leadframe 20 to completely cover the leadframe. Then, openings are formed in film 24 to define contact regions 26 through which fingers 22 are exposed. Preferred openings have a dimension along a finger of 4 to 25 mils. Openings from less than 1 mil to at least 25 mils are easily produced photolithographically. A dimension of about 4 mils to about 15 mils is most preferred. In the same photolithographic step film 24 is also removed from portions of the leadframe that will be used for external contact. Thus, underlying metal of leadframe 20 is exposed in contact regions 26 and along package leads 28. Portions of film 24 between fingers 22 can also be removed in this step if desired.

Openings in insulating film 24 can be provided by traditional photolithographic process using both a photoresist, and an insulator masked by the resist. However, providing both the insulating film and the masking material all with a single material would provide significant advantages and is disclosed hereinbelow. Applicants have found that insulating film 24 can be formed from a photo-imagable material such as Vacrel 8000 (a registered trademark of DuPont), a poly (ethyl acrylate) photopolymer system. With Vacrel 8000, portions of insulating film 24 can be removed directly using photolithographic techniques. Vacrel 8000 can be applied as a dry film and photolithographically exposed so as to remove the film in contact regions.

Contact regions 26 can also be photolithographically formed in a non-photo-imagable insulator, such as polyimide, by first blanket depositing the insulator, then applying a photoresist, optically patterning and chemically developing the resist, and then etching openings in the insulator through the pattern developed in the resist using methods well known in the art. The photo-imagable material described above has the advantage of requiring fewer process steps compared to non-photo-imagable materials.

Figure 2A:
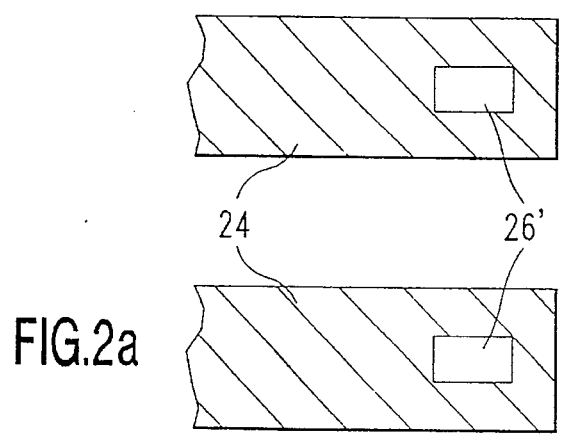
FIG. 2a is a top view of a portion of a leadframe similar to that illustrated in FIG. 2 but with openings spaced from finger edges.

It is preferred that contact regions in film 24 not extend to the edge of fingers where adjacent fingers are held at different potentials. FIG. 2a illustrates the optimal placement of contact regions 26' relative to the edges of fingers 24. This recess from the finger edges provides at least three advantages, as follows: (a) later-deposited silver is deposited farther away from corners and edges and farther away from adjacent fingers, reducing the electric field driving silver migration; (b) the quantity of silver available to migrate is reduced; and (c) the distance silver must migrate to produce a short is increased. A preferred recess is about 0.1 to about 2 mils.

Figure 3:
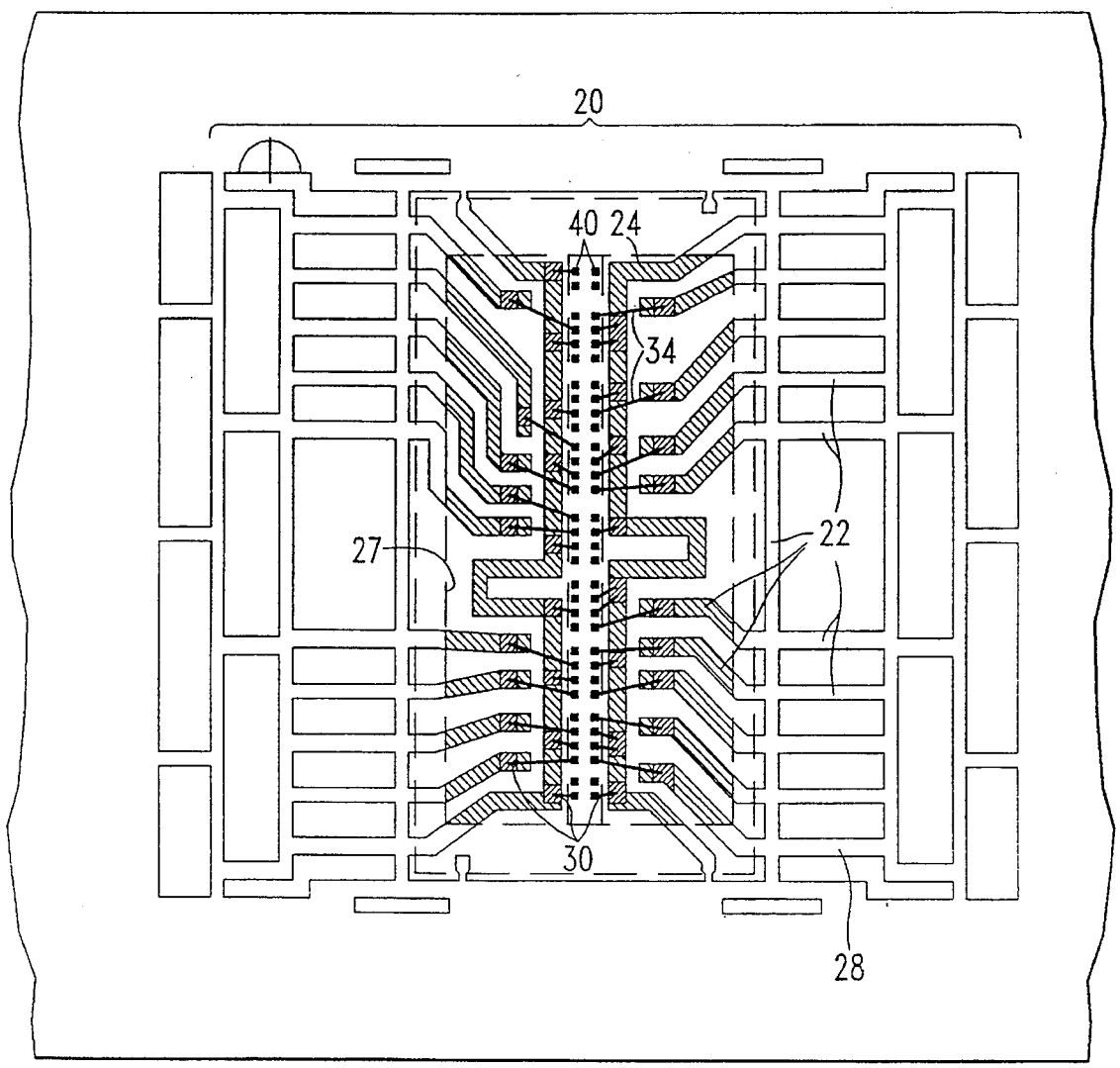
Figure 4:
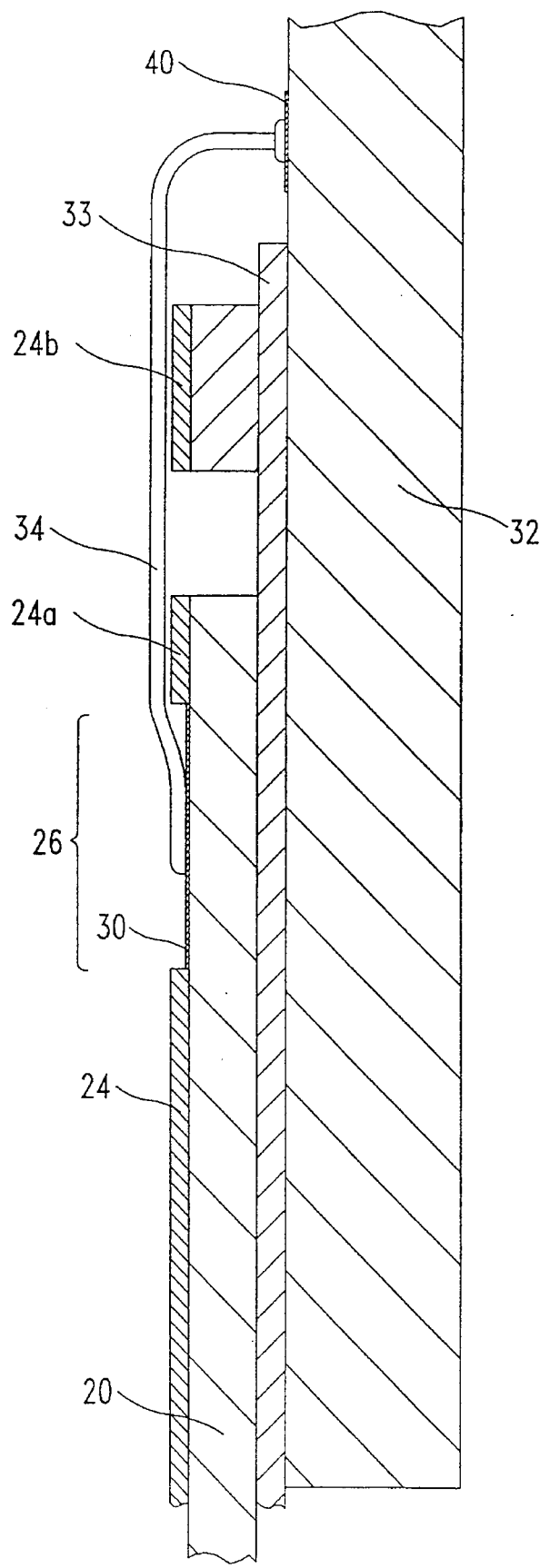
FIG. 4 is a cross-sectional view of a leadframe of the present invention at the step illustrated in FIG. 3.

Silver is then plated in contact regions 26 or 26' forming wire bond pads 30 using methods such as electroplating or electroless plating, as illustrated in FIGS. 3 and 4. Plating is exclusively in areas of exposed underlying conductor. A rubber mask (not shown) is used to protect exposed leads 28 of leadframe 20 from the plating solution, so that the leads emerge bare both of insulator and of silver.

A silver thickness of about 5 micrometers is preferred and silver thickness is usually in the range of 3 to 10 micrometers. A significantly thinner layer can also be plated as described in the '774 patent. However, the invention is independent of silver thickness. By limiting the plating to contact regions 26 or 26' of the leadframe, the present invention provides a smaller volume of silver in the package at any desired thickness of silver compared to methods that plate a large area of the leadframe.

Applicants have found that Vacrel 8000 provides satisfactory resist protection during the silver plating. In an experiment, silver was plated using several plating baths including Silverjet 220 and 300 SD (trademarks of LeaRonal). In either bath, Vacrel 8000 withstood plating performed at a temperature of 140 and 160 degrees F., at pH 7 and 9 for times ranging up to 120s, for example.

In the next step, semiconductor integrated circuit chip 32 is attached to leadframe 20 using polyimide tape 33 (FIG. 4). Wire bonds 34 for interconnecting chip pads 40 and silver-coated pads 30 in openings in insulating film 24 are formed using conventional techniques. Note that insulator portions 24a, 24b beneath wire 34 provide physical support or insulation from other fingers. Finally, the leadframe-chip assembly is encapsulated in a package, such as a molded plastic package (not shown) by conventional means, leaving portions of the leadframe exposed for external connection. Note that such a package would contact insulator 24, which provides enhanced adhesion.

As described above, by photolithographically defining the areas where silver (or any other noble metal) is to be plated on the conductive fingers of a leadframe, the invention eliminates silver electromigration problems. The invention also prevents wire bond crossover shorting problems by keeping the insulator in place on the finished leadframe (see the insulator portions 24a, 24b beneath wire bond 34). Finally, the invention provides an insulator surface that adheres well to plastic sealants. The invention provides a simple, cost-effective solution to all of these problems.

While several embodiments of the invention, together with modifications thereof, have been described in detail herein and illustrated in the accompanying drawings, it will be evident that various further modifications are possible without departing from the scope of the invention. For example, openings in the insulating film can be formed by alternate methods, such as screen printing an insulating film or laser ablation of a previously formed film. The examples given are intended only to be illustrative rather than exclusive and nothing in the above specification is intended to limit the invention more narrowly than the appended claims.

What is claimed is:

1. A semiconductor package comprising:

a leadframe having a contact finger with a portion for encapsulation within the package;

said portion having a first and a second region, said first region being covered by an insulating film, said second region being uncovered by said insulating film, said second region having a contact metal thereon, wherein said contact metal provides a pad for contacting said leadframe, said first region being substantially free of said contact metal, said insulating film being a polymer.

2. A semiconductor device as recited in claim 1, wherein said contact metal comprises a noble metal.

3. A semiconductor device as recited in claim 2, wherein said noble metal comprises silver.

4. A semiconductor device as recited in claim 1, wherein said insulating film comprises a photo-imagable film.

5. A semiconductor device as recited in claim 4, wherein said insulating film comprises a poly ethyl acrylate photopolymer.

6. A semiconductor device as recited in claim 1, wherein said finger has an edge adjacent a second finger, said second region being recessed from said edge.

7. A semiconductor device as recited in claim 6, wherein said second region is recessed by about 0.1 to about 2 mils.

8. A semiconductor device as recited in claim 1, wherein said second region has a dimension along said finger, said dimension being about 4 mils to about 25 mils.

9. A semiconductor device as recited in claim 1, wherein said noble metal comprises silver, said second region is photolithographically defined, and said finger has an edge adjacent a second finger, said second region being recessed from said edge.

10. A semiconductor device as recited in claim 1, further comprising a chip having a chip contact pad, said chip contact pad wire bonded to said contact metal.

11. A semiconductor device as recited in claim 10, further comprising a molded package for receiving said portion.

12. A semiconductor device as recited in claim 1, wherein said second region is defined by said first region.

13. A semiconductor device as recited in claim 12, wherein said second region is photolithographically defined.

14. A semiconductor device as recited in claim 1, wherein said insulating film comprises polyimide.

* * * * *